(12) United States Patent
Radens et al.

(10) Patent No.: US 6,501,117 B1
(45) Date of Patent: Dec. 31, 2002

(54) STATIC SELF-REFRESHING DRAM STRUCTURE AND OPERATING MODE

(75) Inventors: Carl J. Radens, LaGrangeville, NY (US); Gary B. Bronner, Stormville, NY (US); Ramachandra Divakaruni, Ossining, NY (US); Jack A. Mandelman, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/007,846

(22) Filed: Nov. 5, 2001

(51) Int. Cl.$^7$ .................... H01L 27/108; H01L 29/76; H01L 29/94
(52) U.S. Cl. ..................... 257/301; 257/302
(58) Field of Search ................ 257/301, 302, 257/329

(56) References Cited

U.S. PATENT DOCUMENTS

| | | | |
|---|---|---|---|
| 5,670,805 A | * 9/1997 | Hammerl et al. | 257/301 |
| 6,200,873 B1 | * 3/2001 | Schrems et al. | 438/242 |
| 6,204,112 B1 | * 3/2001 | Chakravarti et al. | 438/243 |
| 6,236,077 B1 | 5/2001 | Gambino et al. | 257/301 |
| 6,259,129 B1 | 7/2001 | Gambino et al. | 257/304 |
| 6,265,279 B1 | 7/2001 | Radens et al. | 438/386 |
| 6,288,422 B1 | 9/2001 | Mandelman et al. | 257/301 |
| 2002/0066925 A1 | * 6/2002 | Gruening et al. | 257/329 |

OTHER PUBLICATIONS

Gruening et al. A Novel Trench DRAM Cell with a VERtical Access Transistor and BuriEd STrap (VERBIEST) for 4Gb/16Gb, IEDM, pp. 25–28, IEEE (1999).

* cited by examiner

*Primary Examiner*—Hoai Ho
*Assistant Examiner*—Tu-Tu Ho
(74) *Attorney, Agent, or Firm*—Graham S. Jones, II; H. Daniel Schnurmann

(57) ABSTRACT

A DRAM cell storage capacitor is formed above the bottom of a deep trench (DT) below an FET transistor. The DT has upper, central and lower portions with sidewalls. A capacitor plate electrode, surrounding the lower DT portion that is doped with a first dopant type, is separated by an interface from a well region surrounding the upper and central portions of the DT that are doped with an opposite dopant type. A source/drain region formed at the top of the cell is doped with the first dopant type. A node dielectric layer that covers the sidewalls and bottom of the lower and central portions of the DT is filled with a node electrode of the capacitor, doped with the first dopant type, fills the space inside the node dielectric layer in the lower part of the DT. Above a recessed node dielectric layer a strap region space is filled with a buried-strap conductor. An oxide (TTO) layer is formed over the node electrode and the buried-strap in the DT. A peripheral gate oxide layer, which coats sidewalls of the DT above the TTO, defines a space which is filled with the FET gate electrode. An outdiffusion region, doped with the first dopant type, is formed in the well region near the buried-strap. The cell has a first state and an opposite state of operation. A punch-through device, formed in the well between the outdiffusion region and the interface, provides a self-refreshing punchthrough current in the cell between the well and the plate in the first state of cell operation. A reverse bias junction leakage current occurs in the cell between the buried-strap and the P-well to refresh the opposite state of cell operation.

20 Claims, 16 Drawing Sheets

STATIC SELF-REFRESHING DRAM STRUCTURE AND OPERATING MODE

BACKGROUND OF THE INVENTION

1. Field of the Invention

The present invention relates to semiconductor memory element, and more particularly to a memory element comprised of a charge transfer device, a charge storage device, and one or more semiconductor junctions.

2. Description of Related Art

It is desired to store data such that it is not necessary to cycle a cell to periodically refresh the state of the data. An SRAM (Static Random Access Memory) is one such type of memory device which does not require periodic refreshing of charge stored in the cell. An SRAM typically requires between four (4) and six (6) individual transistors in each memory cell, and hence consumes a relatively large area on the chip as compared with a single (1) transistor DRAM (Dynamic Random Access Memory) cell. However, a DRAM cell requires periodic refreshing of the charge to retain the data stored in that DRAM cell. "Structure and Process for Fabricating a 6F2 DRAM Cell Having Vertical MOSFET and Large Trench Capacitance" referring to FIGS. 1 and 2 thereof a deep storage trench (DT) with a substantially rectangular design is formed in a semiconductor substrate. The DT has a capacitor formed in the bottom region thereof. A vertical MOSFET is formed in the region of the DT. The capacitor includes an N+ plate formed about the exterior of the trench. There is an N band region formed in the substrate abutting the deep trench and the upper surface of the N+ plate. A storage node dielectric (26) lines the walls of the DT and the node electrode (28) of the capacitor composed of N+ polysilicon is formed in the DT inside the storage node dielectric (26). Before or after forming the storage node electrode (28) in the bottom portion of the trench, a relatively thick collar (30) is formed above the N+ doped capacitor plate (22) so as to provide isolation between the capacitor and the MOSFET. A polysilicon strap region (38) is formed on the sidewalls of the DT above the relatively thick collar (30). Above the storage node electrode (28) and the polysilicon strap region (38), a Trench Top Oxide (TTO) (32) is formed. Above the TTO the DT is lined with a gate oxide layer (34) and a N+ polysilicon gate conductor (GC) (36) composed of doped polysilicon is formed. FIG. 14 shows, an "outdiffused strap" formed adjacent to the strap region (38) in a P-well (66) with a bitline diffusion (64) thereabove. Note that the P-well 66 is isolated from the N+ doped capacitor plate (22) by an N band region (24). As shown in FIGS. 3 and 14, on one side of the DT, the GC, the TTO, the strap polysilicon and an upper corner of the storage node polysilicon and the collar have been etched away and then filled with oxide cap (42) formed with a material such as CVD oxide. While there are similarities, as will be described below, the structure is substantially different from the structure of the present invention. In particular, as dimensional constraints force narrower capacitor dimensions, we have found that the thickness of the collar around the upper portion of the capacitor is a problem since it increases the width of capacitor and a solution to that dimensional problem is important.

More importantly, a solution to the problem of refreshing of DRAM cells is needed. There is nothing in the above patent (422) suggests a self-refreshing DRAM cell design. Instead, the patent (422) is designed to avoid providing any parasitic effects or punchthrough and the P-well doping concentration is kept low enough to prevent reverse bias junction leakage between the buried-strap and the P-well. The Mandelman et al. design avoids the effects which are achieved by the present invention.

Gruening et al. "A Novel Trench DRAM Cell with a VERTical Access Transistor and Buried Strap (VERIBEST) for 4 Gb/16 Gb" IEDM, pp 25–28, IEEE (1999) describes a doping profile of the P-well selected to maintain a concentration below 7 times 10 to the $17^{th}$ per cm3 in proximity to the buried-strap which leads away from the teachings of the present invention as is typical of conventional DRAM design, as is well known by those skilled in the art.

Commonly assigned U.S. Pat. No. 6,236,077 of Gambino et al. for "Trench Electrode with Intermediate Conductive Barrier Layer" shows a strap formed above the collar of a trench capacitor and discusses the fact that materials can be used in the capacitor structure to minimize parasitic effects.

Commonly assigned U.S. Pat. No. 6,259,129 of Gambino et al. for "Strap with Intrinsically Conductive Barrier" describes a buried-strap which resides over the trench electrode (capacitor node).

Commonly assigned U.S. Pat. No. 6,265,279 of Radens et al for "Method for Fabricating a Trench Capacitor" describes a trench capacitor formed as part of a trench capacitor memory cell wherein parasitic transistor leakage (which in the past could have been reduced by using a thicker collars) has been reduced by implanting dopant into sidewalls of the trench extending outwardly of the trench to disrupt the parasitic transistor.

Heretofore, it is clear that the objective in the art has been to suppress parasitic transistors and currents in the regions of doped semiconductor regions surrounding trench capacitors.

SUMMARY OF THE INVENTION

An object of this invention is to provide a dense DRAM type of memory cell which does not require periodic refreshing of the charge.

In particular, there are problems as follows:
a) refreshing a DRAM memory cell without wordline/bitline (WL/BL) cycling;
b) offsetting DRAM memory cell (junction) leakage currents to obtain data retention and product operating margins;
c) relaxing storage node electrode leakage requirements and/or storage capacitance requirements.

An advantage of this invention is that it provides a self-refreshing DRAM memory cell with two stable static states of operation. In the first stable static state, the DRAM memory cell automatically holds a binary one voltage level by exploiting parasitic leakage current between the storage node electrode and the buried plate electrode. In the second stable static state, the DRAM memory cell automatically holds a binary zero (0) by exploiting parasitic leakage current between the storage node electrode and the P-well.

In accordance with this invention, controlled leakage currents are used to provide automatic-refreshing in a "Self-Refreshing Single-Capacitor Random Access Memory (SSRAM)" structure as follows:
a) for a stored binary one (1), there is a controlled gate assisted punchthrough current between node diffusion and plate;
b) for a stored binary zero (0), there is a controlled junction leakage current to the P-well.

This invention provides a new cell structure that provides automatic static refreshing of charge to maintain the stored data. Thus the standard DRAM dynamic charge refreshing cycle may be eliminated. Optionally, the standard dynamic charge refreshing cycle may be used, but the storage capacitance, and accumulated process/structural complexity may be reduced.

In accordance with this invention the buried plate is biased at a voltage of about +1.2V and the P-well is biased at a voltage level of about −0.5V or below.

In accordance with another aspect of this invention, the structure is capable of punchthrough between the strap and plate during the presence of a stored binary one (1) by forming the N+ strap in close proximity to the N+ plate and selection of the associated junction profiles including the buried-strap outdiffusion, P-well and buried plate.

Further in accordance with this invention, the distance between the strap outdiffusion region in the P-well and the N+ plate electrode is between about 50nm and about 300 nm. The optimum distance is dependent upon doping concentration between the node electrode and the plate. Punchthrough leakage current through the P-well between the strap/storage node electrode and the buried plate electrode refreshes the charge which represents the stored binary one (1).

In addition, the P-well doping profile is graded to induce junction leakage between the strap and the P-well during the presence of a stored level binary zero (0). The doping of the P-well to a concentration of dopant above $6E17/cm^3$ induces junction leakage between the N+ buried-strap and the P-well. Thus the doping constraint on the P-well adjacent to the strap diffusion, which must be observed in a conventional DRAM, is relaxed and/or eliminated.

Challenges in connection with this invention are as follows:

a) Control of strap-to-plate depth and P-well profile.
b) Leakage and reliability of the full plate voltage across the thin node dielectric layer.

In accordance with this invention, a device is provided by starting with a deep trench having sidewalls and a bottom that is formed in a semiconductor substrate. The trench has upper, central and lower portions. A buried plate electrode of a capacitor which is formed in the substrate, surrounding the lower portion of the deep trench, is doped with a first dopant type and is separated by an interface from a well region that surrounds the upper and central portions of the deep trench. The well region is doped with an opposite dopant type. A cap region is formed above the well doped with the first dopant type. A node dielectric layer covers the sidewalls and the bottom of the lower and central portions of the deep trench and the node dielectric layer defines a node electrode space in the lower and central portions of the deep trench. The node electrode space is filled with a node electrode of the capacitor. The node electrode is doped with the first dopant type. A buried-strap region space, preferably in the form of a node dielectric layer recess, is formed about the upper portion of the node electrode. The strap region space is filled with a buried-strap. A trench top dielectric layer is formed above the node electrode and the buried-strap covering the top of the central portion of the deep trench. A gate oxide layer is formed on the sidewall surfaces of the upper portion of the deep trench. A gate electrode fills the space in the deep trench defined by the gate oxide layer. An outdiffusion region doped with the first dopant type is formed in the well region proximate to the buried-strap. The cell includes an FET transistor formed above the buried-strap and connected thereto having binary states comprising a first state and an opposite state of operation. The cell includes a punchthrough device formed in the well between the outdiffusion region and the interface. The punchthrough device provides a punchthrough current which provides self-refreshing current in the cell between the well and the plate in the first state of operation of the cell. In the opposite state of operation of the cell, the punchthrough device provides reverse bias junction leakage in the cell between the buried-strap and the well refreshing the opposite state of operation of the cell.

Preferably, in a binary one stable state, the device automatically holds a binary one by exploiting leakage between the node electrode and the buried plate electrode through an expanded outdiffusion depletion region in the well surrounding the outdiffusion region and an expanded depletion region in the well between the interface and the outdiffusion depletion region which merge. In a binary zero stable state, the device automatically holds a binary zero by preventing leakage between the node electrode and the buried plate electrode through a contracted outdiffusion depletion region in the well that surrounds the outdiffusion region and a contracted depletion region in the well between the interface and the outdiffusion depletion region that are separate regions in the well.

Preferably, the outdiffusion region is located from about 50 nm to about 300 nm from the interface between the well region and the buried plate electrode.

Preferably, the node dielectric layer and the buried-strap have a thickness from about 2 nm to about 10 nm.

Preferably, the outdiffusion region is juxtaposed with the buried-strap and centered thereon.

Preferably, the buried-strap extends about 160 nm above the interface between the well region and the plate electrode.

DESCRIPTION OF THE DRAWINGS

The above and other aspects and advantages of this invention are explained and described below with reference to the accompanying drawings wherein.

DESCRIPTION OF THE PREFERRED EMBODIMENT

FIGS. 1A–1L show a sequence of steps in the manufacture of a semiconductor DRAM cell 9 being formed in a portion of an SRAM in a substrate 10. The DRAM cell 9 includes a Deep Trench (DT) 15 with a Deep Trench (DT) capacitor 16 (shown in FIGS. 1C–1K). The substrate 10 is composed of a material such as single crystal silicon, or a III-V compound such as GaAs, InP, or Silicon-On-Insulator (SOI).

Figure 1A:
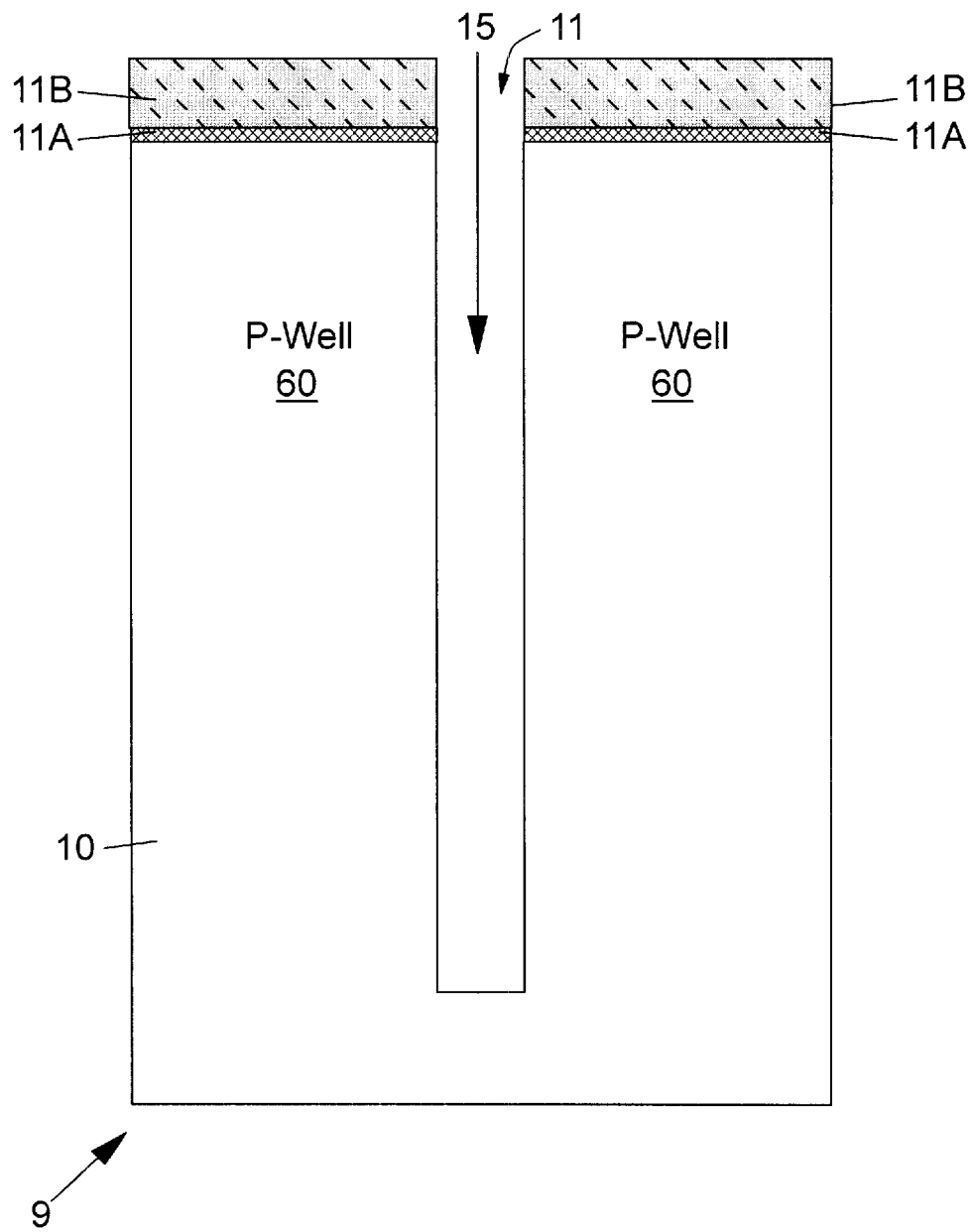
FIGS. 1A–1L show a sequence of steps in the manufacture of a device being formed as a portion of an SRAM memory array in accordance with this invention.

Referring to FIG. 1A, the deep trench 15 has been formed by etching through a pad nitride film 11B and a pad oxide film 11A, e.g. a thin film of silicon oxide. The pad nitride film 11B is a layer of silicon nitride ($Si_3N_4$) from about 10 nm to about 500 nm thick that is preferably deposited by LPCVD (Low Pressure Chemical Vapor Deposition) over the pad oxide film 11A. The pad films 11A/11B were previously patterned and etched to form an aperture 11 therethrough that is employed for etching to form the deep trench 15.

To produce the structure of semiconductor DRAM cell 9 shown in FIG. 1A, the deep trench 15 is formed using methods known to those skilled in the art, e.g. photolithography and dry etching through the aperture 11. The P-well region 60, which is formed in the substrate 10, surrounds the trench 15. The P+ doped, P-well region 60 can be formed by conventional processing by using techniques selected from ion implantation, epitaxial silicon growth, and/or thermal diffusion, as will be well understood by those skilled in the art. For example, the P-well 60 can be formed by ion implantation into the semiconductor substrate 10.

Figure 1B:
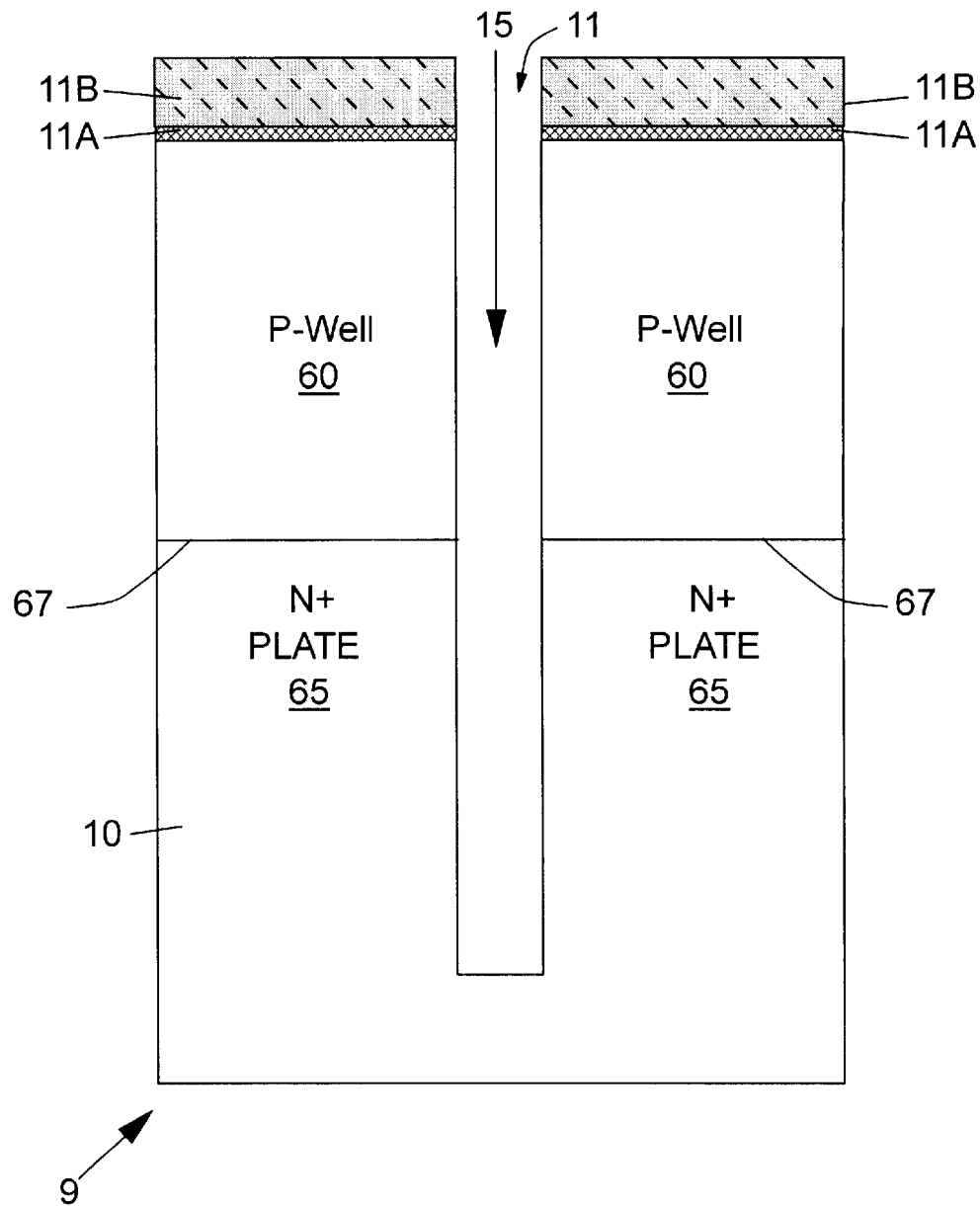

Referring to FIG. 1B, an N+ doped plate region 65, that will serve as the outer electrode of the deep trench capacitor 16 (see FIGS. 1B and 1C), is then formed in the semiconductor substrate 10, located in the region surrounding the lower portion of the deep trench 15, leaving the P-well 60 above the buried N+ plate region 65 surrounding the upper portion of the deep trench 15. Between the P-well region 60 above and the buried N+ plate 65 region in FIG. 1B a semiconductor junction line 67 is shown marking the location of a semiconductor junction.

Figure 1C:
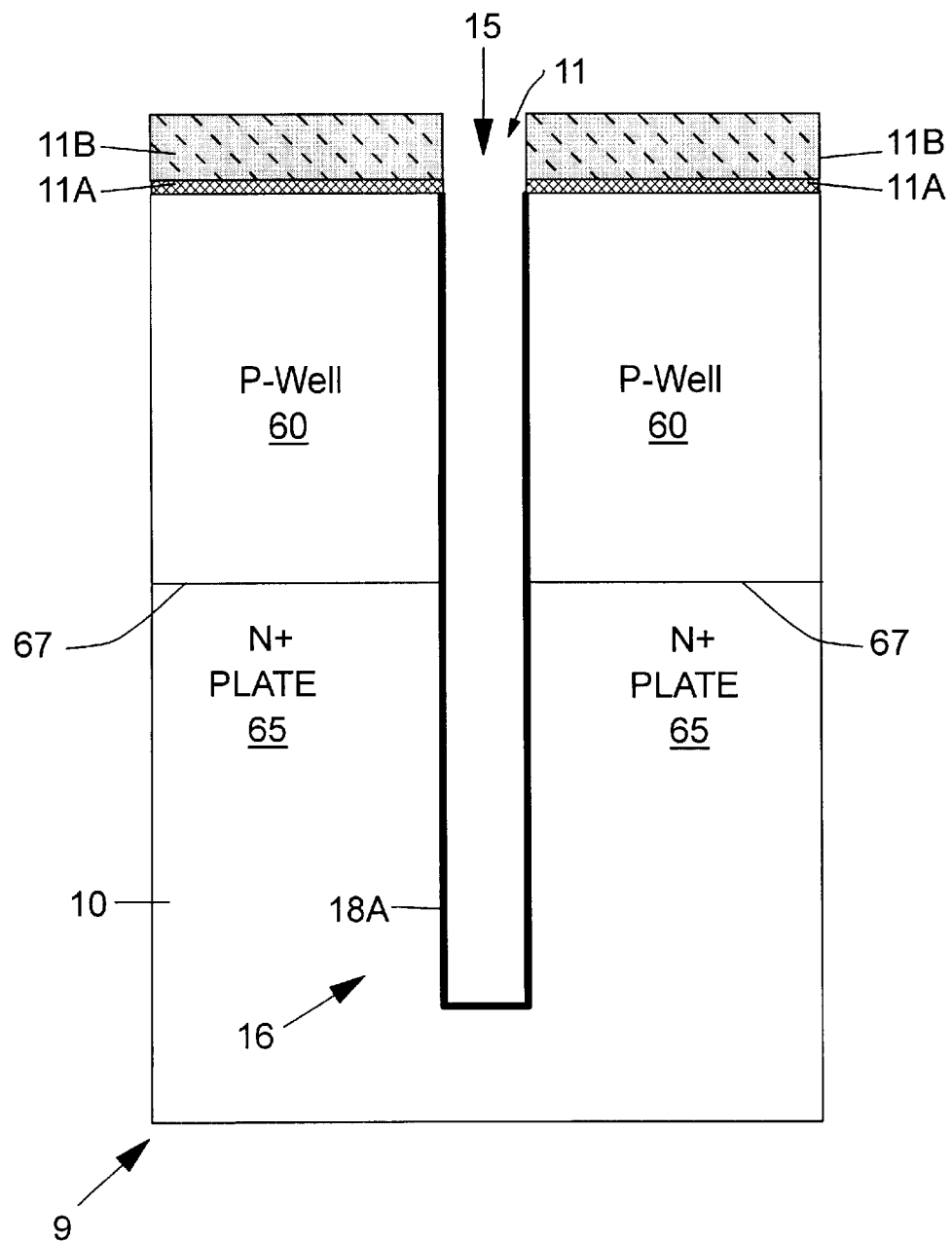

FIG. 1C shows the semiconductor device 9 of FIG. 1B after the exposed bottom surface and the exposed sidewall surfaces of the deep trench 15 have been coated with a thin film, dielectric layer 18A to be used as the node dielectric layer 18 for the DT capacitor 16. The dielectric layer 18A can be composed of a material such as a thin film (2 nm–10 nm thick) of silicon nitride ($Si_3N_4$) that is deposited into the deep trench 15 to cover the bottom and sidewalls thereof by a process such as LPCVD.

Figure 1D:
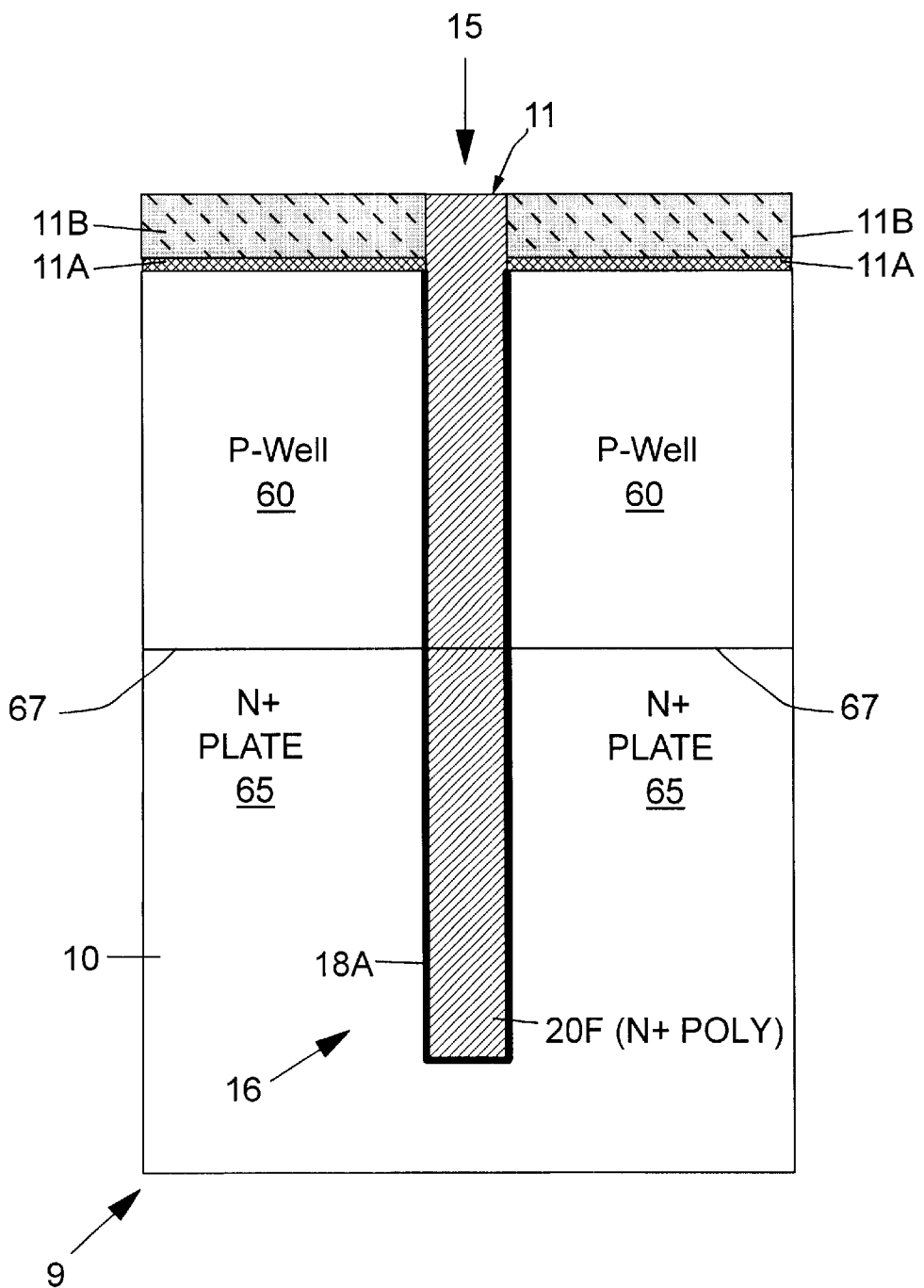

FIG. 1D shows the semiconductor device 9 of FIG. 1C after a preliminary step in the formation of the node electrode 20 shown in FIG. 1E to 1K, that is the deposition of a layer of trench fill 20F comprising N+ doped, polysilicon inside the thin film dielectric layer 18A at least to the top of the deep trench 15 and probably overfilling the deep trench 15. Preferably, the trench rill 20F is the N+ doped, polysilicon that is deposited by LPCVD deposition. Trench fill 20F fills the deep trench 15 from the bottom to at least to the top thereof. If required, the next step is to planarize the trench fill 20F by CMP (Chemical Mechanical Planarization) or the equivalent.

Then, referring to FIG. 1E the semiconductor device 9 of FIG. 1D is shown after the trench fill material 20F has been etched back (preferably by a dry etching process) well below the top of the deep trench 15 but above the semiconductor junction line 67 to form the inner plate or storage node electrode 20 of the deep trench capacitor 16 of FIGS. 1E to 1L. The depth to which the trench fill material 20F is etched back is preferably on the order of 140 nm leaving the top surface of the trench fill material 20F, i.e. storage node electrode 20, about 160 nm above the semiconductor junction line 67. Control of the precise depth to which the trench fill material 20F is etched back is achieved by means of timing or by use of a measurement instrument such as an interferometer, as will be well under-stood by those skilled in the arts of processing and measurements in microelectronic manufacturing.

Figure 1E:
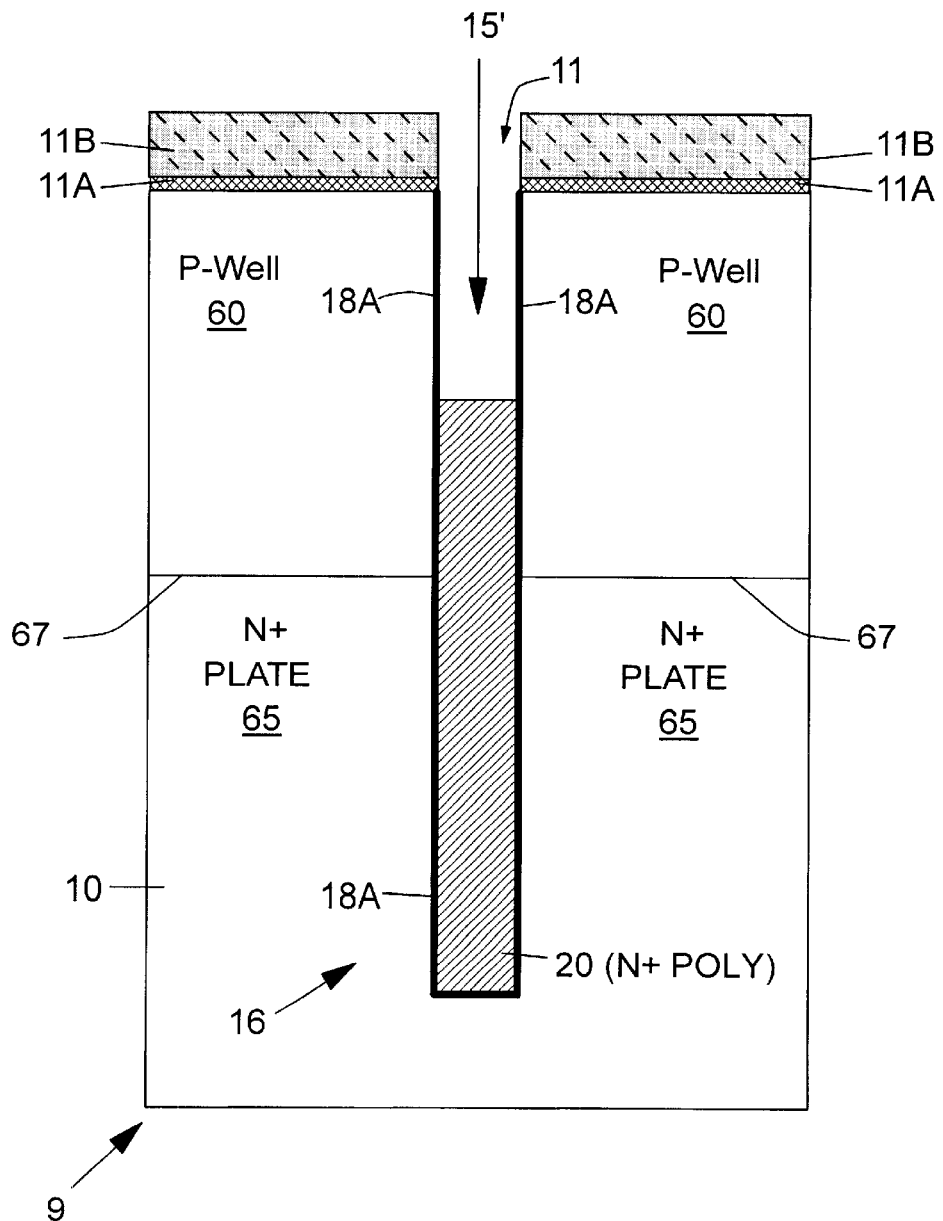
Figure 1F:
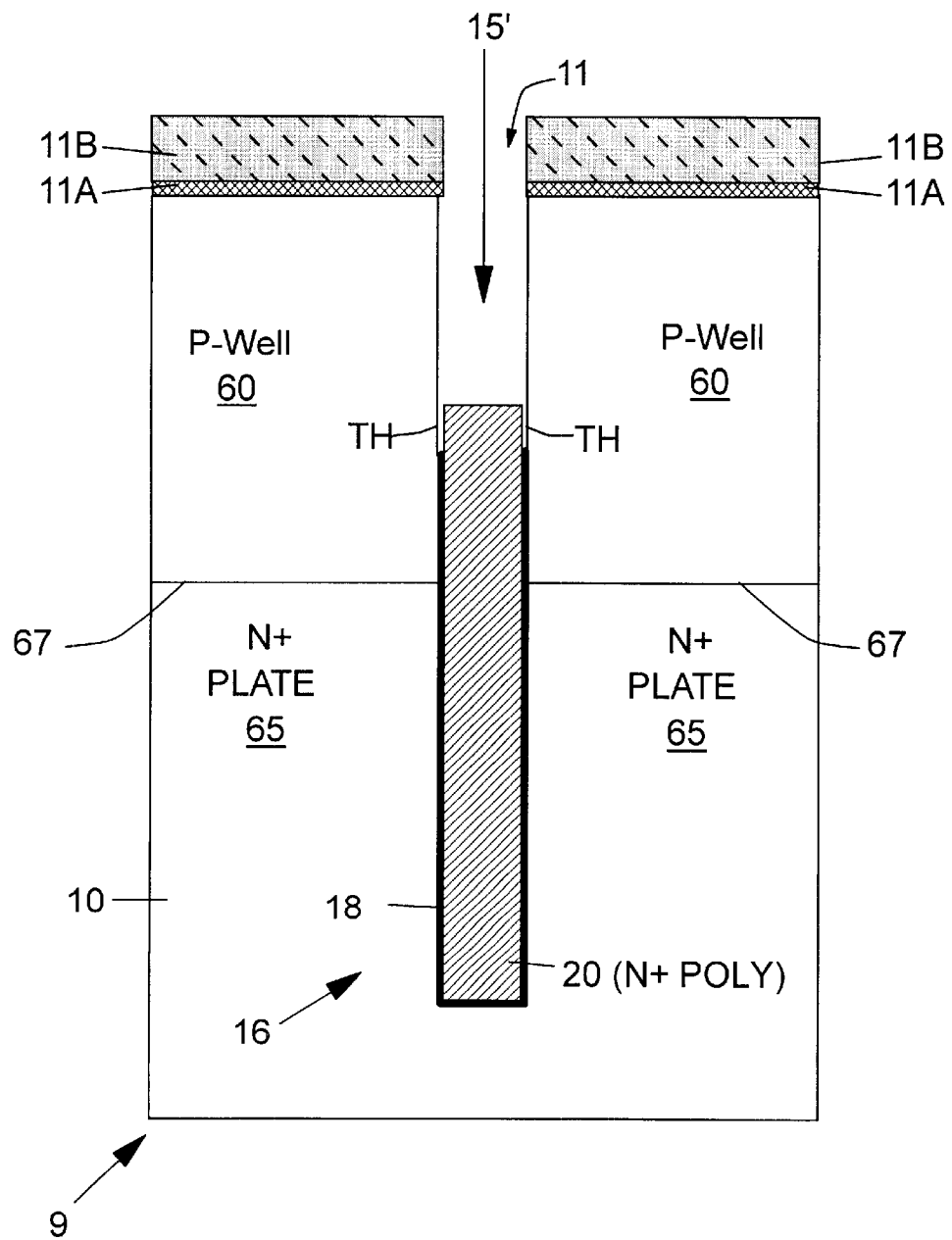

After the trench fill material 20F has been etched back, the space above the storage node electrode 20 comprises an upper trench 15' that is the portion of deep trench 15 that remains substantially empty at this point, except that all of the thin film dielectric layer 18A remains temporarily in the upper trench 15' until after the step shown in FIG. 1F.

Referring to FIG. 1F, the semiconductor device 9 of FIG. 1E is shown after an isotropic wet etch that etches back the upper portions of thin film dielectric layer 18A to remove it down to the desired level that is well below the top of the node 20 about 130 nm above the semiconductor junction line 67. That etching step forms a thin peripheral strap slot TH around the top of the node electrode 20 recessing the capacitor dielectric 18 of the deep trench capacitor 16 below the top of the node electrode 20. This leaves the upper trench 15' empty with slot TH extending below the periphery thereof. The depth of the slot TH is controlled by processing parameters which control the depth of etching by timing the duration of the wet etch. If the depth of the strap slot TH is five times the thickness of the thin film dielectric layer 18A, then the duration of the etch is extended to five times the duration required to etch through the dielectric layer 18A. For example, if the dielectric layer 18A is 4 nm thick, then the wet etch continues long enough to etch through a film 20 nm thick Strap slot TH creates an open space providing rooms for the formation of a thin film buried-strap ST on the periphery of the top of the node electrode 20 as shown in FIG. 1G.

Figure 1G:
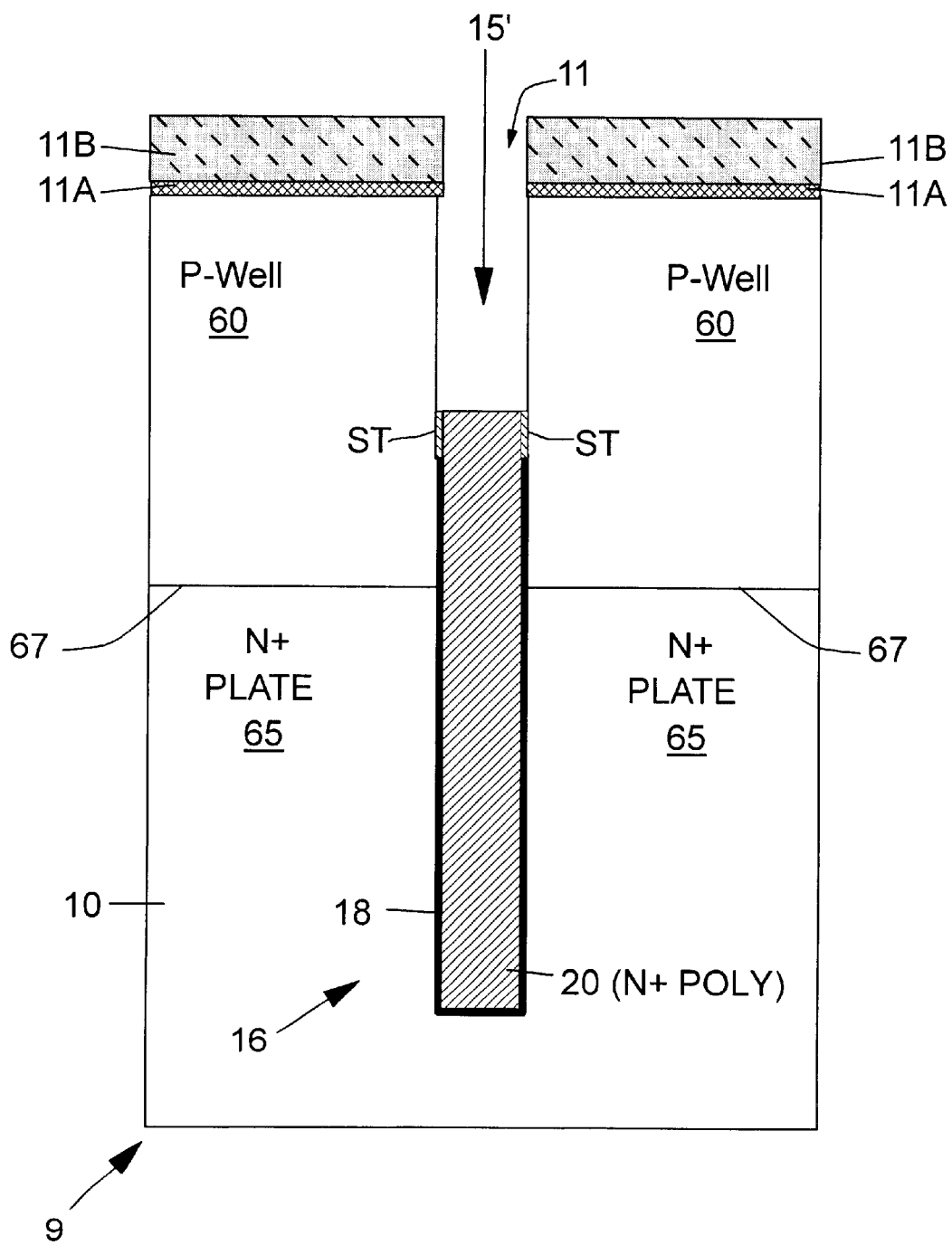

FIG. 1G shows the semiconductor device 9 of FIG. 1F after forming a polysilicon buried-strap ST in slot TH by deposition of a thin conducting film such as doped silicon.

The next step is to perform an isotropic etch back of the thin conducting film such as silicon to the level of the top of the capacitor storage node electrode 20 leaving slot TH filled with the buried-strap conducting film ST, as shown in FIG. 1G. The thin polysilicon strap ST can be intrinsic silicon, that can be doped or undoped at this point, deposited by LPCVD or it can be amorphous, microcrystalline, polycrystalline or epitaxial silicon forming a bridge between the P-well 60 and the top portion of the node electrode 20. The etching back of the surplus silicon to recess the buried-strap ST to the level of the top of the node electrode 20 can be performed by a process such as a wet chemical etch or a CDE (Chemical Dry Etch) that lasts for a timed duration or that is terminated by an end point detection process.

Figure 1H:
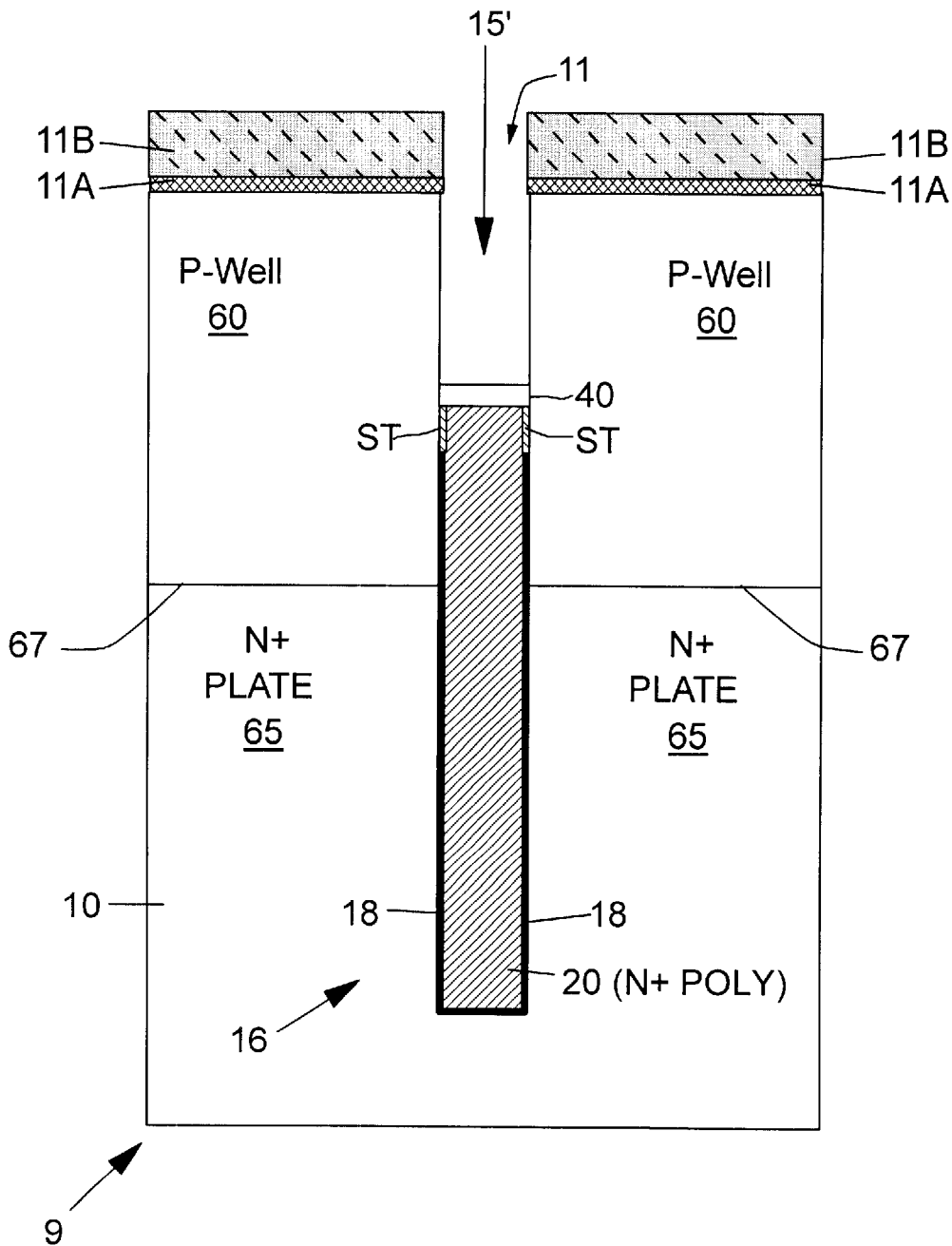

Next, FIG. 1H shows the semiconductor device 9 of FIG. 1G after the Trench-Top silicon Oxide (TTO), dielectric/insulator layer 40 has been deposited at the bottom of upper trench 15' by means of a process such as anisotropic High Density Plasma (HDP). The TTO dielectric/insulator layer 40 covers both the top of the node electrode 20 and the top of the buried-strap ST. At this point the unwanted/surplus TTO dielectric/insulator layer 40 may be removed from the surface of the workpiece by CMP.

Figure 1I:
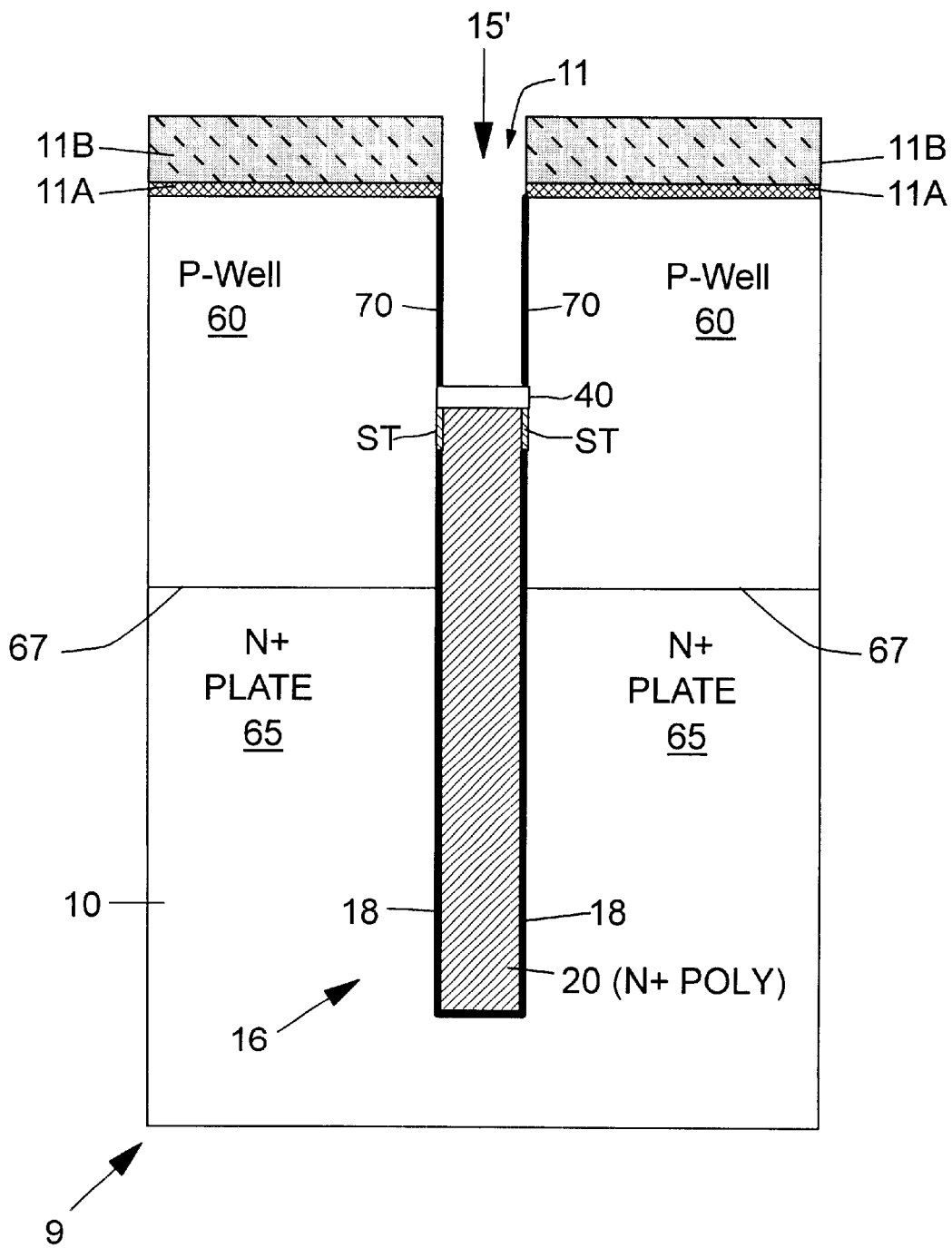

Then, as shown in FIG. 1I, the semiconductor device 9 of FIG. 1H is subjected to a process such as thermal oxidation of the silicon of the P-well 60 on the sidewalls of upper trench 15' to form a vertical gate oxide layer 70 comprising a thin film of silicon oxide.

Figure 1J:
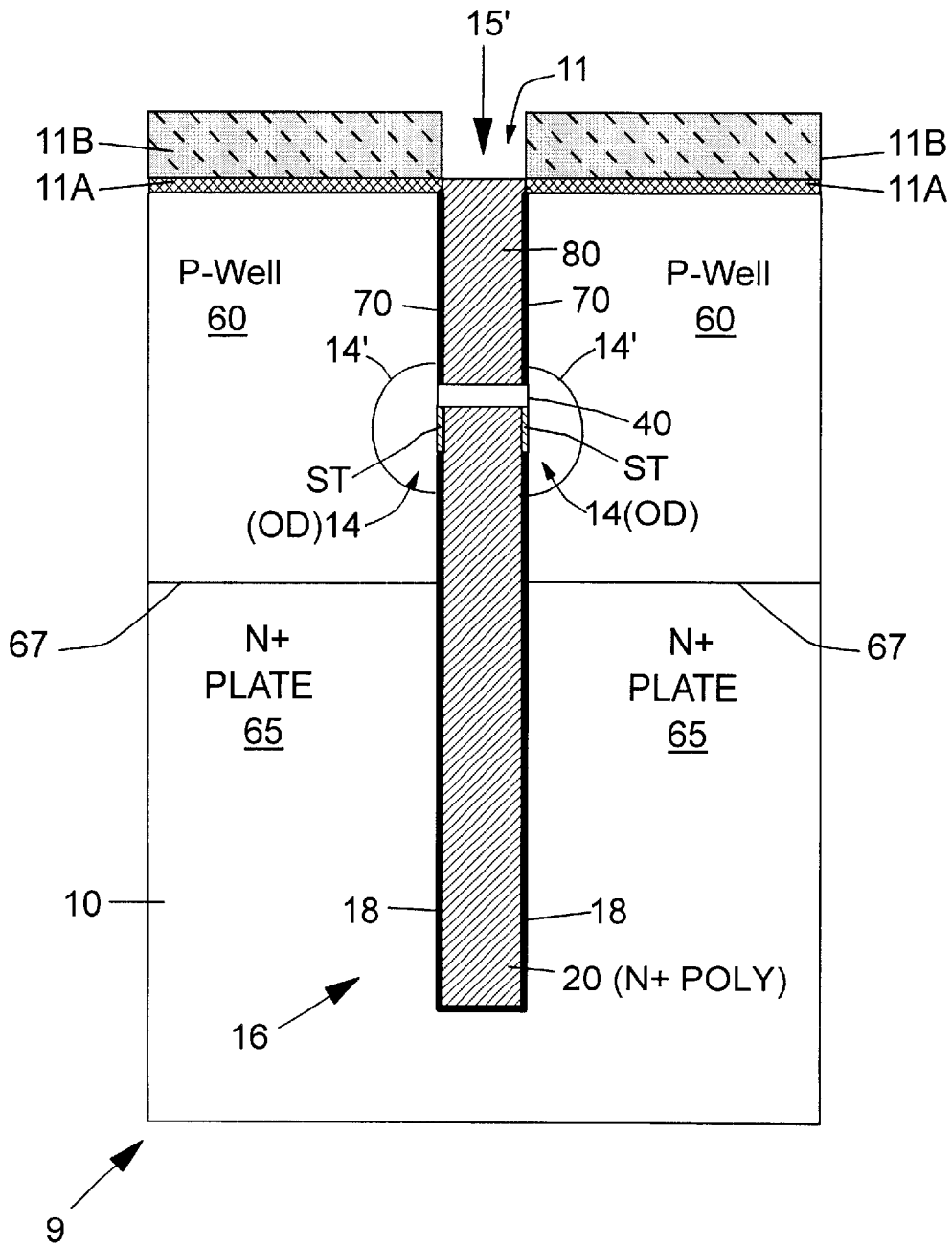

Next, referring to FIG. 1J, the remaining space in upper trench 15' of FIG. 1I (defined by the vertical gate oxide layer 70 on the sidewalls and the TTO layer 40 on the bottom) is filled with a gate electrode 80 that is formed of doped polysilicon that is planarized by a dry etching process and recessed to the level of the substrate surface. At this point a step of annealing of the device 9 creates an outdiffusion (OD) region in the P-well 60 adjacent to the buried-strap ST by outdiffusion of N+ dopant from the N+ doped polysilicon node 18, which at this point has just begun to occur by diffusion of N+ ions through the strap ST into the P-well 60. This process will continue as the usual additional annealing steps are performed.

The OD region 14, which has an outer boundary 14', is shaped by relatively uniform diffusion of N+ ions symmetrically through and from the buried-strap ST passing into the P-well 60 and the distance from the buried-strap is about 40 nm horizontally and about 30 nm vertically from the center of the buried-strap ST/P-well 60 interface. The duration and temperature of the annealing step is adjusted to assure that the OD region 14/P-well 60 interface is located in the desired position to achieve the parasitic currents desired when the DRAM cell 9 is in operation.

Figure 1K:
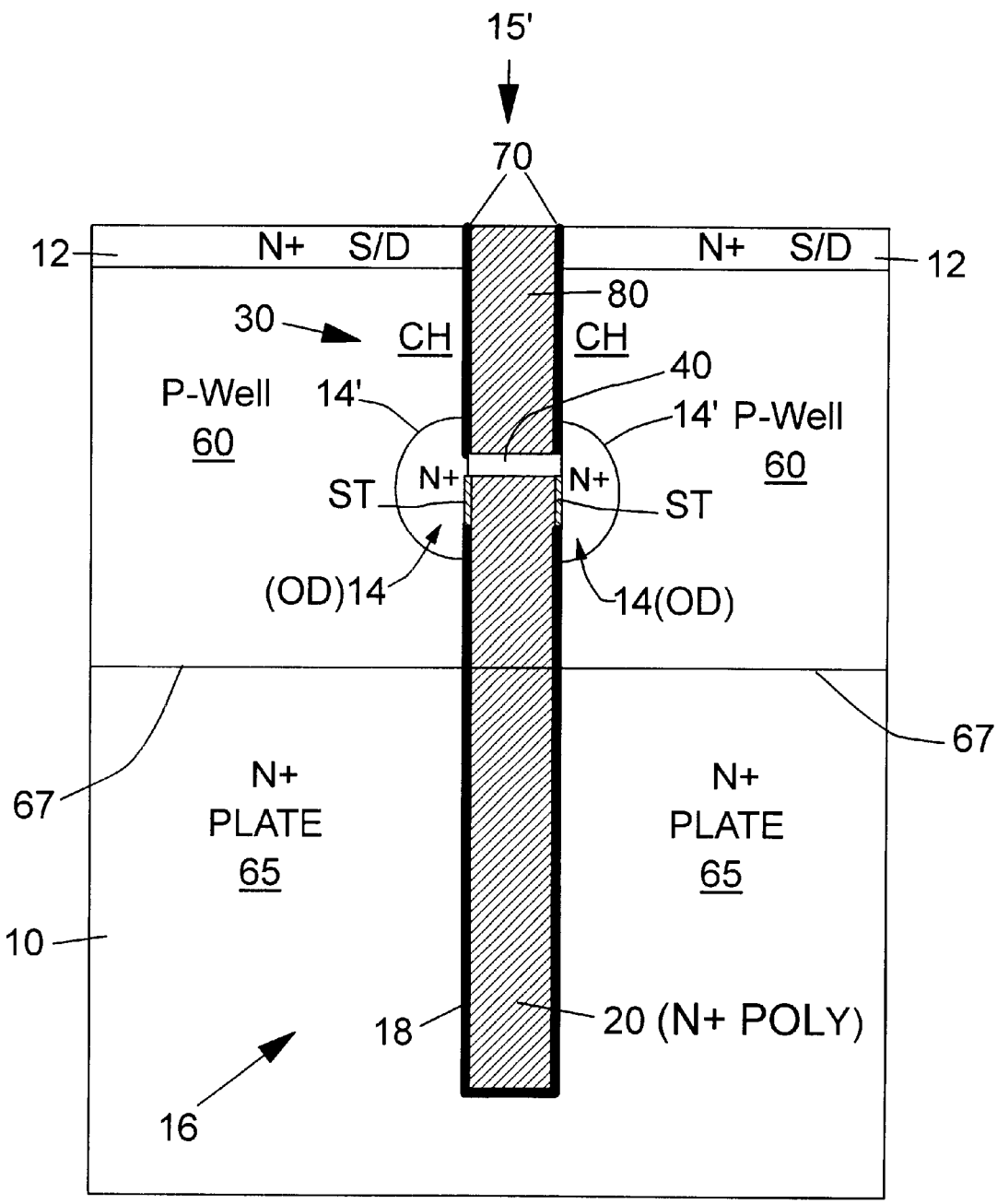

FIG. 1K shows the device 9 of FIG. 1J after stripping away the pad nitride film 11B and the pad oxide film 11A by planarization of the top surface of device 9 by a process such as CMP followed by ion implanting the source/drain cap region 12 in the top surface of the P-well 60, as shown.

Figure 1L:
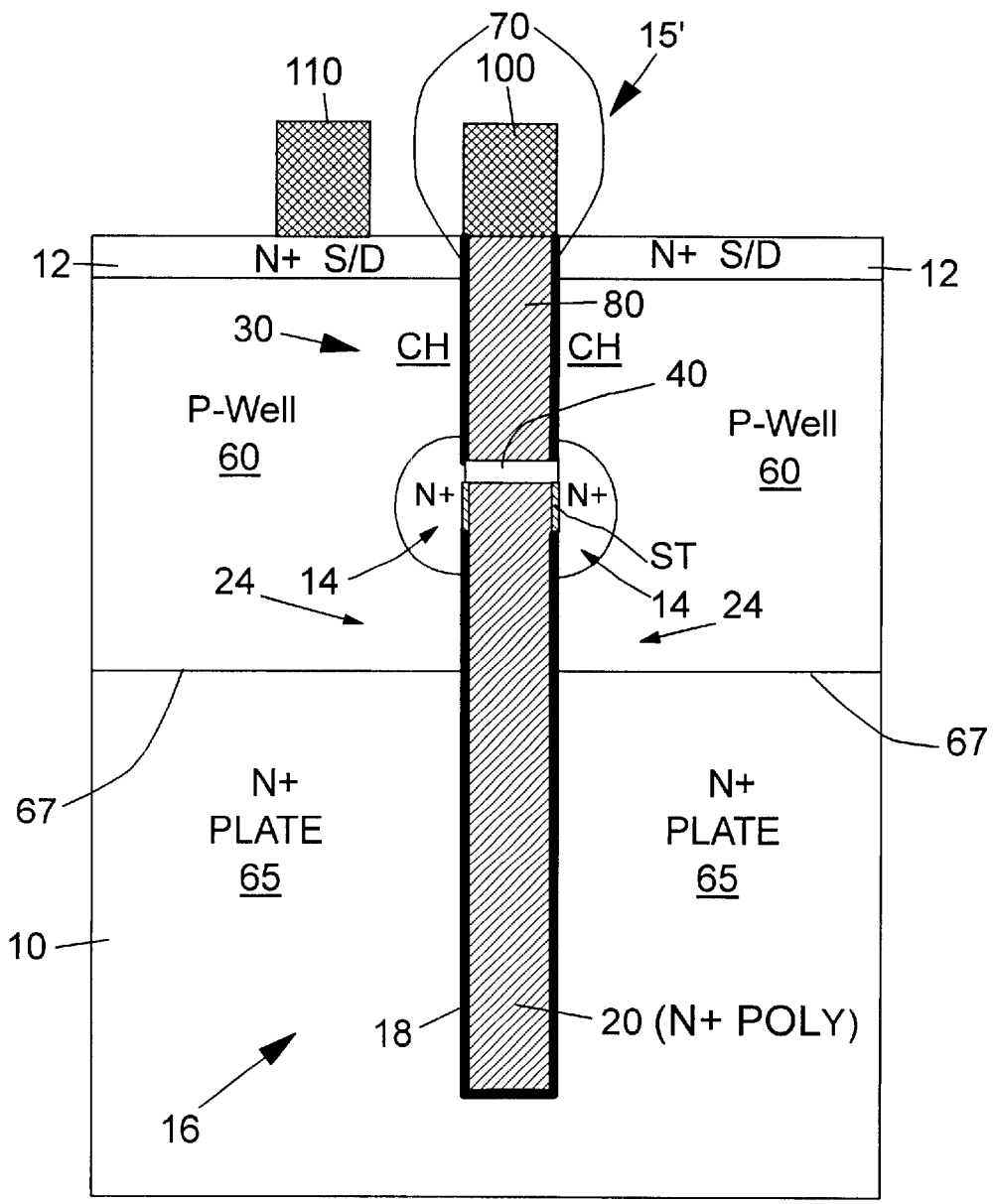

FIG. 1L shows the memory element structure of FIG. 1K after completion of the process of forming the semiconductor device 9 itself. A wordline 100 and a bit diffusion contact 110 are formed in device 9 of FIG. 1J by depositing doped polysilicon followed forming a photolithographic, photoresist mask and Reactive Ion Etching (RIE) to remove the portions of the doped polysilicon exposed by openings in the mask.

The wordline 100 is formed on the top surface of the gate electrode 80 at the top of the upper trench 15'. The bit diffusion contact 110 is formed on the top surface of the N+ doped source/drain region 12 to form a source/drain contact.

Background pertinent to the above processing steps is explained in Gruening et al. "A Novel Trench DRAM Cell with a VERTical Access Transistor and Buried Strap (VERIBEST) for 4 Gb/16 Gb" IEDM, pp 25–28, IEEE (1999); Radens et al. "An Orthogonal 6F$^2$ Trench-Sidewall Vertical Device Cell for 4 Gb/16 Gb DRAM", pp. 349–352, IEDM (2000); and Radens et al. "A 0.135 $\mu$m$^2$6F$^2$ Trench Sidewall Vertical Device Cell for 4 Gb/16 Gb DRAM", pp. 80–81, 2000 Symposium on VLSI Technology Digest of Technical Papers, IEEE (June 2000).

In summary, the recessed the node dielectric layer 18 and the recessed node electrode 20 are shown with the node electrode 20 in electrical contact with the sidewalls of the P-well through the N+ doped, buried-strap ST and the outdiffusion (OD) region 14, juxtaposed with the buried-strap ST that has been formed by outdiffusion of N+ dopant from the node electrode 20, as described above.

Note that the buried-strap ST and the OD region 14 are spaced above, but in sufficiently close proximity to the semiconductor junction line 67 at the top of the buried external plate electrode 65 to permit establishment of a punchthrough leakage current when the capacitor 16 is storing a voltage representing a binary one (1). The TTO insulator layer 40 provides electrical insulation between the gate electrode 80 above the recessed node electrode 20 and above the buried-strap ST. Above the TTO insulator layer 40, the gate oxide layer 70 has been formed on the sidewalls of the upper trench 15' reaching to the top thereof within which the gate electrode 80 is formed.

By the above processing steps, a vertically oriented, NMOS FET, pass transistor 35 has been formed in semiconductor device 9. The vertically oriented gate electrode 80 of the NFET 35 has been formed in the upper trench 15', above the TTO insulator 40, filling it to the top within the MOS gate oxide layer 70. The portion of the P-well 60 alongside the gate oxide 70 serves as the channel CH of the NFET pass transistor 35.

The N+ doped source/drain cap region 12 comprise one source/drain region of the NFET pass transistor 35. In addition, the N+ doped source/drain outdiffusion (OD) 14 formed by annealing comprises the other source/drain region of the NFET pass transistor 35. In other words, one source/drain region of the NMOS FET transistor 35 comprises the OD region 14 that is formed by the N+ doped buried-strap OD and the other source/drain region comprises the N+ doped cap region 12 formed as the N+ doped surface band/cap on top of semiconductor device 9.

The gate electrode wordline 100, that is formed on and connected to the surface of the gate electrode 80 above the substrate 10, is separated from the N+ doped silicon, source/drain cap region 12 by the gate oxide layer 70.

In addition, to the left of the wordline 100, the bit diffusion drain contact 110 is formed on and connected to the surface of the N+ doped silicon, source/drain cap region 12.

The buried-strap ST and the OD region 14 are located between about a minimum spacing parameter of about 50 nm and a maximum spacing parameter of about 300 nm from the semiconductor junction line 67 between the buried plate electrode 65 and the P-well 60 as a function of the parameters that will best provide the punchthrough current in accordance with this invention in one of the stable states of operation the memory/storage device 9. Accordingly, for those minimum and maximum spacing parameters the value of the P-Well voltage $V_{P-WELL}$ is about −0.5V.

Figure 2A:
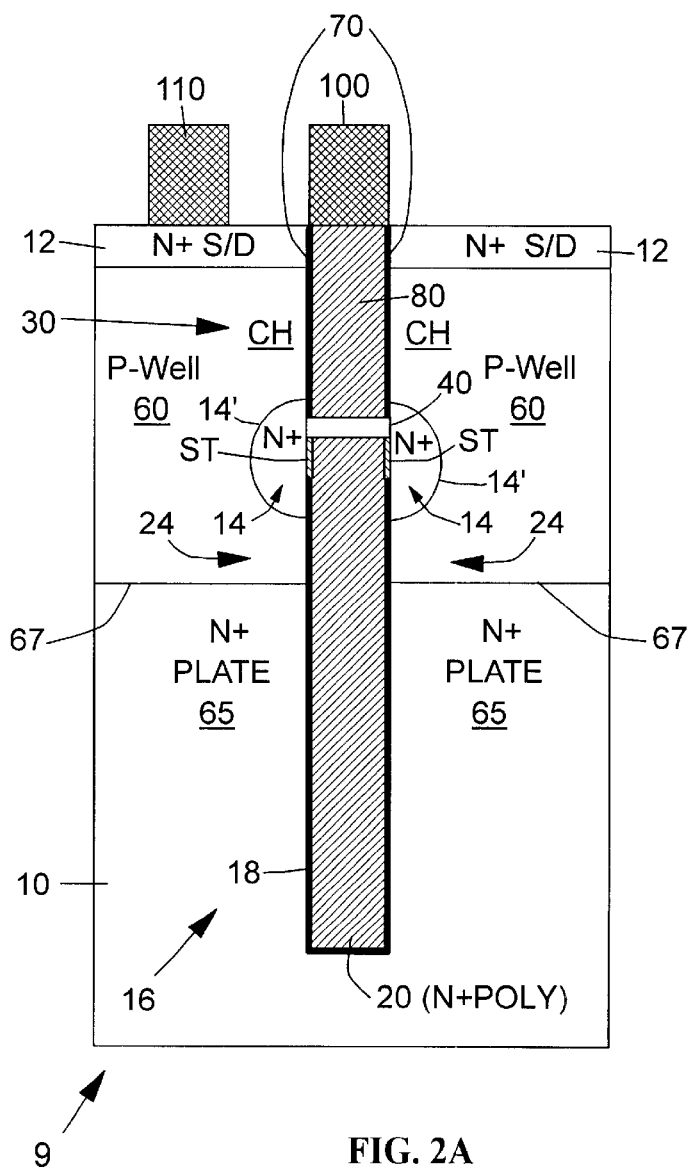
FIG. 2A shows the device of FIG. 1C after the manufacture thereof.

FIG. 2A shows the device of FIGS. 1A–1L after completion of manufacture thereof.

Figure 2B:
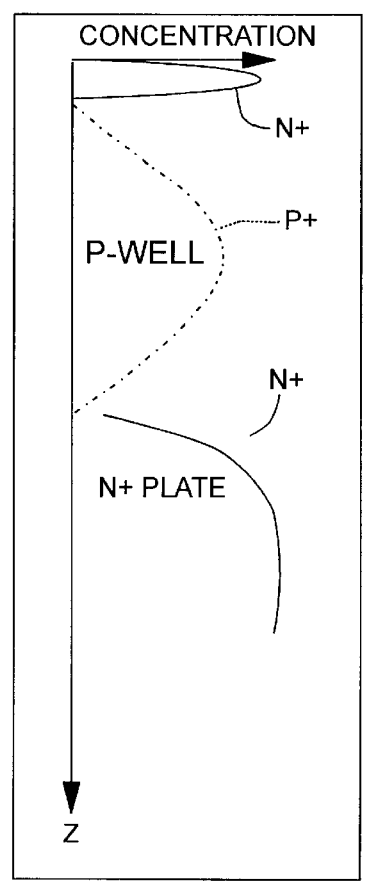
FIG. 2B, that is located on the right side of FIG. 2A, shows a dopant impurity concentration depth profile, that is aligned on the page to indicate the relative doping concentration away from the storage node outdiffusion, source/drain region.

On the right side of FIG. 2A, FIG. 2B is a graph which shows a curve of the dopant impurity concentration profile, that is aligned on the page to indicate the relative maximum of the P+ dopant concentration in the P-well 60 at the buried-strap ST/OD region 14. The actual P type dopant concentration in the P-well 60 is based upon a series of ion implantation steps with varying doses and degrees of energy which gives the desired type of profile indicated by the curve in FIG. 2B. The P+ doping concentration diminishes away from the level of the buried-strap ST/outdiffusion region 14 in directions of the source/drain cap region 12 and the buried external plate electrode 65. In other words, in a preferred embodiment, the peak P-well 60 P+ dopant concentration exists at the depth of the buried-strap ST/OD region 14. That configuration induces a current in the form of reverse-bias junction leakage between the buried-strap ST/OD region 14 and the P-well 60.

Thus, in the P-well 60, there is a peak concentration value of P type dopant greater than or equal to about 1E18/cm$^3$ aligned approximately at the top of the combined OD region 14/buried-strap ST for a predetermined level of buried-strap ST to P-Well 60 leakage as contrasted to the conventional concentration value of less than or equal to about 6E17/cm$^3$.

At greater depths in the P-well 60, the concentration value between the buried-strap OD 14 and the N+ doped buried plate electrode 65 is less than or equal to a concentration value of about 4E17/cm³ depending upon the spacing of the buried-strap ST from the semiconductor junction line 67 at the top of the buried plate 65 as contrasted to the conventional concentration values of greater than or equal to about 7E17/cm³.

Figure 3:
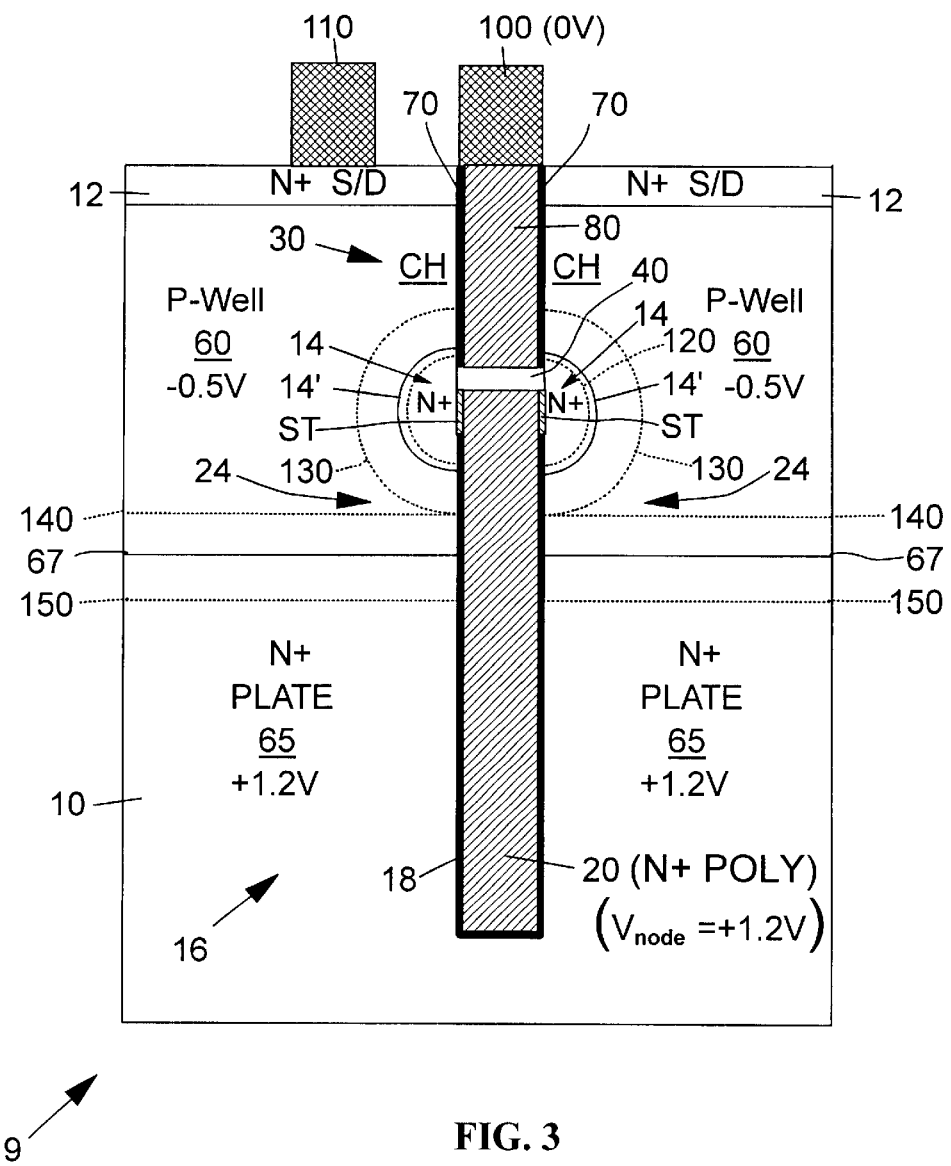
FIG. 3 shows the memory element of FIG. 1C after an electrical bias has been applied to store a previously written logical binary one (1).

FIG. 3 shows the memory element 9 of FIG. 1C after an electrical bias has been applied to store a previously written logical binary one (1). The binary one (1) is written into the memory element 9 by turning on the transfer gate electrode 80 by application of a bias voltage greater than the transfer gate threshold voltage to the wordline electrode 100 combined with simultaneous application of a binary one (1) voltage to the source/drain cap region 12 through the bit contact 110. As a result, the node electrode 20 will be electrically connected to the bitline bias voltage at the bit contact 110. An example of the bias voltages for storage of the binary one (1) can be −0.5 Volts on P-well 60, +1.2 Volts stored on the capacitor 20, and +1.2 Volts on the N+ doped buried plate electrode 65, which is externally biased as will be well understood by those skilled in the art, and 0 Volts on the gate electrode 80.

On the one hand, inner depletion region 120 extends inwardly from the periphery of the buried-strap OD region 14 into the interior of OD region 14.

On the other hand, outer depletion region 130 extends outwardly from the periphery of the buried-strap OD region 14 into the P-well 60.

Additional upper depletion regions 140 and 150 extend from the semiconductor junction line 67 between the buried N+ doped buried external plate electrode region 65 and the P-well 60.

Upper depletion region 140 extends upwardly from the semiconductor junction line 67 into P-well 60. Lower depletion region extends downwardly from the semiconductor junction line 67 into the N+ doped, buried plate electrode 65. The cell 9 includes the FET transistor 35 having binary states comprising a first state and an opposite state of operation above the buried-strap ST which is connected thereto. The cell includes a punchthrough device 24 formed in the P-well 60 between the periphery 14' of outdiffusion region 14 and interface at the semiconductor junction line 67. In the state of operation shown in FIG. 3, the punchthrough device 24 provides a punchthrough (parasitic) current which provides self-refreshing current in the cell 9 between P-well 60 and the N+ plate 65 therebelow in the binary one (1), first state of operation of the cell 9.

When the condition exists during that the outer depletion region 130 and the upper depletion region 140 are merged, a punchthrough leakage current is introduced through the semiconductor junction line 67 and P-well 60 between the buried N+ region 65 and the N+ doped buried-strap OD region 14.

With a stored binary one (1), there is an expansion of the outer depletion region 130 surrounding the OD region 14 that is assisted by sidewall gating from the node electrode 20, that results in such a punchthrough leakage current between the node electrode 20 and N+ doped buried plate electrode region 65, that flows through the node electrode 20 and OD region 14. Hence the stored binary one (1) is refreshed by the leakage from the node electrode 20 through the buried-strap OD region 14 down to the N+ plate 65.

In the present of a stored binary zero (0) the punchthrough cell 24 turns off the parasitic current causing reverse bias junction leakage in the cell 9 between the P-well 60 and the buried-strap 14 which refreshes the cell 9 in opposite state of operation of cell 9.

Figure 4:
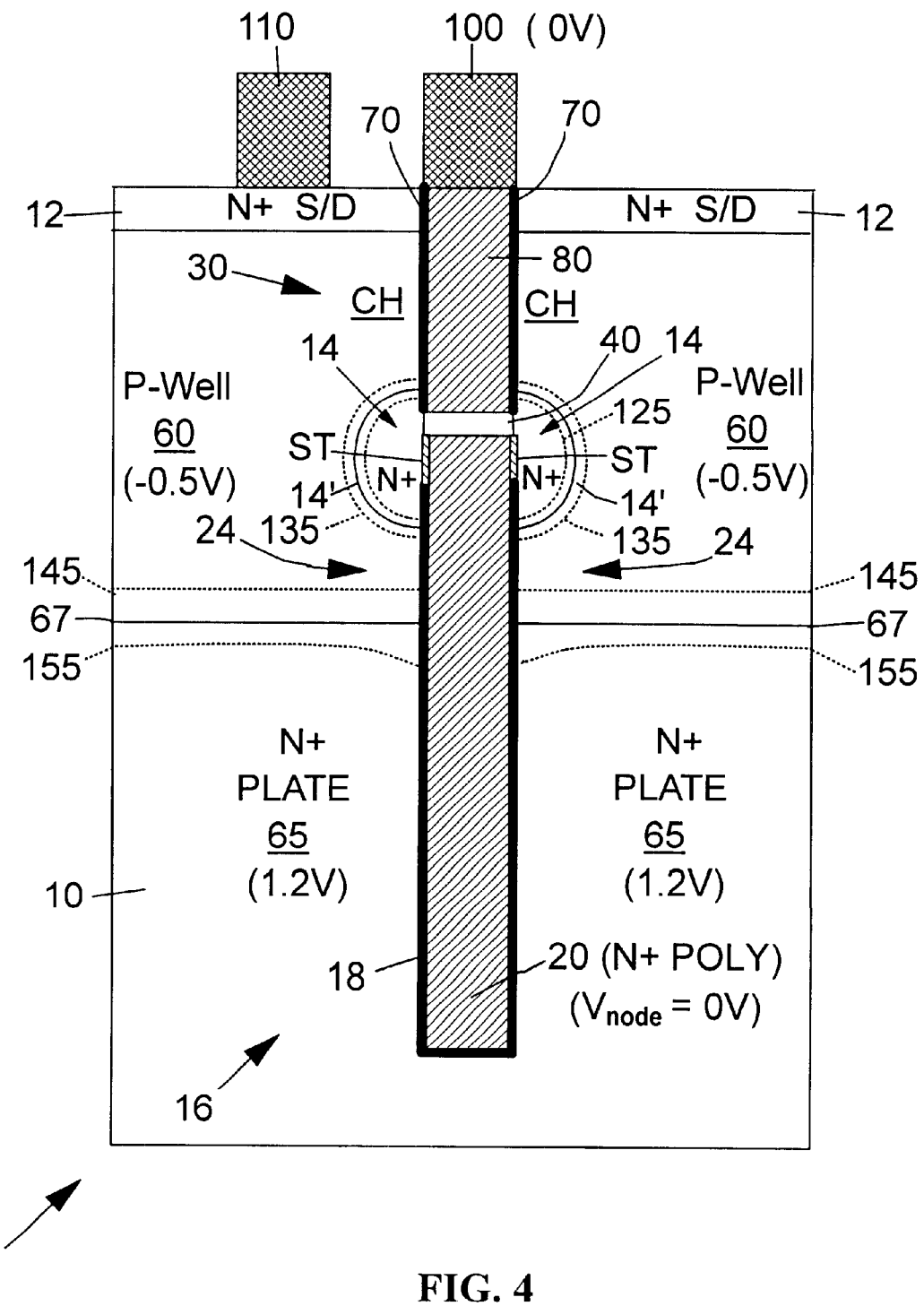
FIG. 4 shows the memory element of FIG. 1C after an electrical bias has been applied to store a previously written logical binary zero (0).

The respective depths of the buried-strap ST/OD region 14 and the N+ doped, buried-plate electrode region 65, and the doping concentrations are selected such that outer depletion region 130 and upper depletion region 140 are merged together during the storage of a logical binary one (1) on the node electrode 20 in capacitor 16. However, the regions 130 and 140 will not merge together during the storage of a logical binary zero (0). Thus, when the stored binary one (1) leaks to a reduced voltage below Vblh ($V_{bit\ line\ high}$), the punchthrough current flowing from the buried-strap/OD region 14 to the buried plate electrode 65 maintains the stored binary one (1). The bit line 210 can have a low voltage value of $V_{bll}$=0V or a high voltage of $V_{blh}$=+1.2V. Other parameters of the device for a logical binary one (1) are as follows:

Parameters: VB=binary one (1)
WL=Off $V_{Wl}$=0V
$V_{P-WELL}$~−0.5V
N+ plate=$V_{blh}$
$V_{node}$~$V_{blh}$; where $V_{blh}$=$V_{bit\ line\ high}$
$V_{node}$=1.2V FIG. 4 shows the memory element of FIG. 1C with an electrical bias applied to store a previously written stored binary zero (0) level. In the present of a stored binary zero (0) the punchthrough cell 24 turns off the parasitic current to the N+ plate 65 from the buried-strap region 14, causing reverse bias junction leakage in the cell 9 between the P-well 60 and the buried-strap 14 which refreshes the cell 9 in opposite state of operation of cell 9. In this case as the punchthrough cell 24 turns off a reverse bias junction leakage current flows in the cell 9 between the P-well 60 and the buried-strap 14. This reverse bias current refreshes the cell 9 in opposite state of operation of cell 9. In this case, a narrower outer depletion region 135 and a shallower upper depletion region 145 are separated by a substantial distance so that the punchthrough device 24 is turned off. That is why there is only a buried-strap to P-well leakage current which retains the node potential at the 0 Volts value of the binary zero (0) state of the cell 9. Again, the bit line 210 can have a low voltage value of $V_{bll}$=0V or a high voltage of Vblh=+1.2V. Other parameters of the cell 9 for a logical binary one (1) are as follows:

Parameters VB=binary zero (0)
WL=Off $V_{Wl}$=0 to −0.2 V
$V_{P-WELL}$~−0.5V
N+ plate=$V_{blh}$ $V_{N+PLATE}$=+1.2V
$V_{node}$=0V The binary zero (0) may be written into the memory element by application of a bias greater than the transfer gate threshold to the wordline electrode 100, and application of a binary zero (0) voltage to the bit contact 110. Node electrode 20 will be electrically connected to the bitline bias at bit contact 110, and hence brought to the binary zero (0) level.

In the case of a stored binary zero (0), the magnitude of the reverse bias on the OD region 14 that is the N+ buried-strap ST/OD region 14 will be less than that of the stored binary one (1), and hence the extent of the inner depletion region 125 and outer depletion region 135 from the OD region 14 into the P-well 60 is reduced relative to the stored binary one (1) case illustrated by FIG. 3.

The depth of the OD region 14 relative to the semiconductor junction line 67 with the N+ buried plate electrode 65, and the doping concentrations are selected such that the outer depletion region 130 and the upper depletion region 140 will merge together during the storage of a logical binary one (1) on the node electrode 20 of capacitor 16. However, referring to FIG. 4, as stated above the smaller regions 135 and 145 do not merge together during the storage of a logical binary zero (0). Instead, the strap depletion collapses with a stored binary zero (0). Thus, the leakage from the node buried-strap junction at OD region 14, in the case of a logical stored binary zero (0), will be dominated by the reverse bias junction leakage between the N+ doped, buried-strap OD region 14 and the P-well 60.

The reverse bias junction leakage pulls down the stored binary zero (0) bias on the node electrode 20 towards the −0.5V bias of P-well 60. Hence, the stored binary zero (0) is refreshed by the P-well 60 junction leakage 14 through the buried-strap OD region 14.

During the presence of a stored binary zero (0), the size and extension of the depletion region 135 about the storage node diffusion 14 is at a minimum, as shown in FIG. 4. Thus, the depletion region 135 and the depletion region 145 (juxtaposed with semiconductor junction line 67) are not in close proximity, so the punchthrough current between the node electrode 20 and buried plate electrode 65 is negligible and is dominated by leakage current between node OD region 14 and the P-well 60. As a result in the case of a stored binary zero (0) the strap junction leakage to the P-well 60 refreshes the stored binary zero (0) condition of the capacitor 16 and maintains it without any external signals being applied.

Figure 5A:
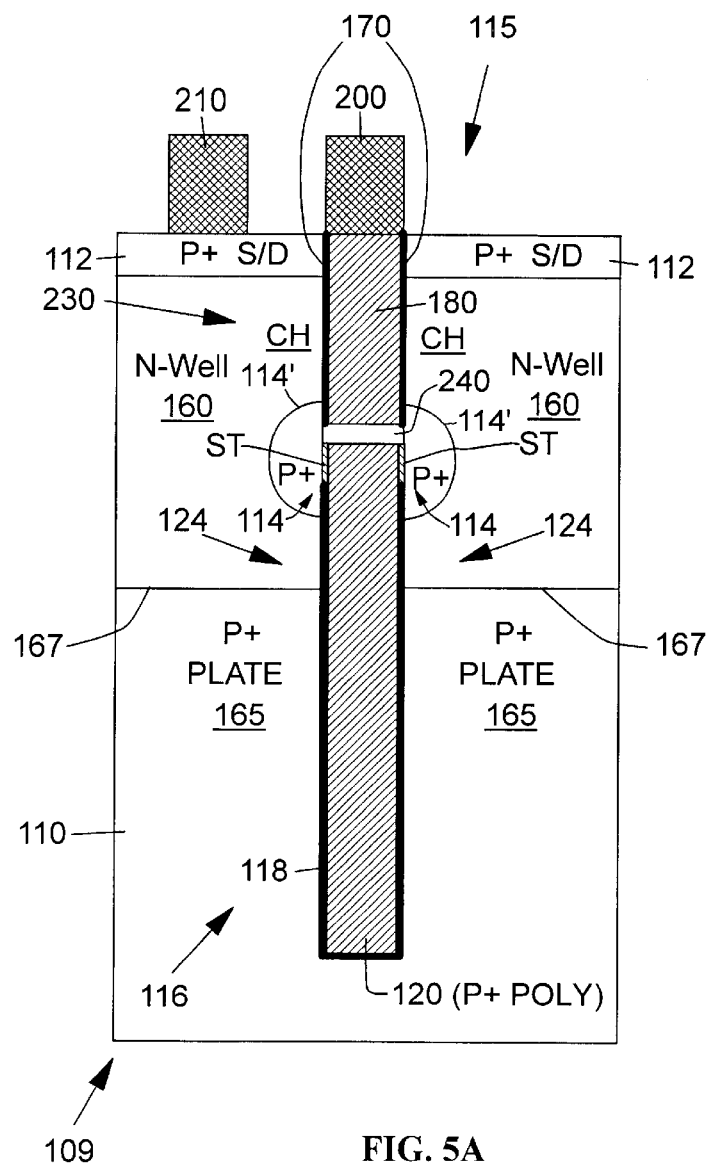
FIG. 5A shows an alternative embodiment with an array of PMOS FET devices in an N-well with a P+ doped outdiffusion region, a P+ doped cap/band serving as a drain and a P+ doped buried plate electrode.

In summary, in the case of a stored binary zero (0) the voltage $V_{node}$ of the node electrode 20 is pulled down by the leakage to the P-well 60. The depletion region 135 about the storage node OD 14 is at a minimum. Punchthrough leakage current between the node 20 and buried plate electrode 65 is negligible and is dominated by leakage current between the storage node ST, OD 14, and P-well 60. Thus the stored binary zero (0) is maintained. The parameters are as follows:

$V_{node} \sim V_{bll} = \sim 0V$
BL (Off)=~0V
WL (Off)=~0 to −0.2V
P-well=~0.5V FIG. 5A shows a sectional view of an alternative embodiment with an array of PMOS FET devices 109 in an N-well 160 with a P+ OD region 114, P+ doped buried plate electrode 165 formed in an N doped substrate (not shown). The node dielectric layer 118 and the node electrode 120 have been recessed. The node electrode 120 is shown in contact with the sidewalls of the N-well 160 through a P+ doped, buried-strap ST and the OD region 114 with the punchthrough device 124 located between the periphery 114' of the OD region 114 and the interface at the semiconductor junction line 167 with N-Well device 109 being analogous in structure and operation to P-well device 9 in FIGS. 2A, 2B, 3 and 4.

Figure 5B:
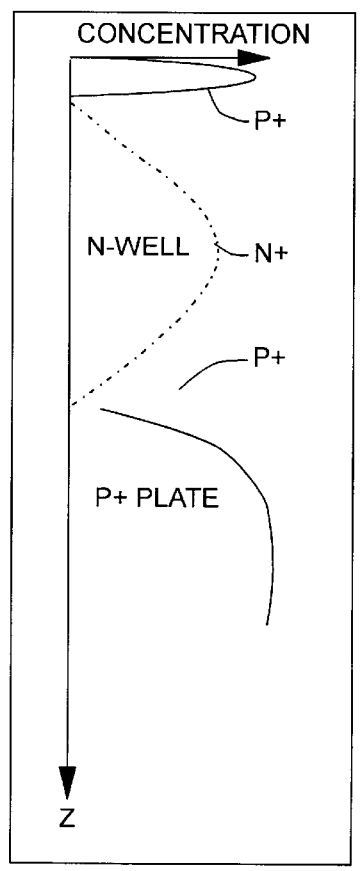
FIG. 5B located on the right side of FIG. 5A shows a dopant impurity concentration depth profile, that is aligned on the page to indicate the relative doping concentration away from the storage node outdiffusion, source/drain region.

FIG. 5B, that is located on the right side of FIG. 5A, shows a curve of the dopant impurity concentration depth profile of N type dopant, that is aligned on the page to indicate the relative doping concentration with respect to the location of the storage buried-strap ST and the OD region 114 as well as the N-well 160. The actual N type dopant impurity concentration in the N-well 160 is based upon a series of ion implantation steps with varying degrees of energy which gives the desired type of profile indicated by the curve in FIG. 5B.

The OD region 114 is spaced above, but in close proximity to the buried plate electrode 165. Above the recessed node electrode 120 and the buried-strap ST is the trench-top oxide (TTO) insulator layer 240. Above the TTO insulator layer 240 is a gate oxide layer 170 that is formed lining the sidewalls of upper portions of the deep trench 115 which layer 170 reaches to the top of trench 115.

Referring again to FIG. 5A, a vertically oriented PMOS FET, transistor 230 includes vertically oriented gate electrode 180 that is formed within the space defined by the thin film, gate oxide layer 160 above the TTO insulator 240 in the upper portion of the trench 115, filling it to the top within the MOS thin film, gate oxide layer 170. The portion of the N-well 160 alongside the gate oxide layer 170 serves as the channel CH of the FET transistor 230. The OD region 114 of the PMOS FET 230, which is juxtaposed with the buried-strap ST and the top of the node electrode 120, is formed by the P+ doped outdiffusion of P+ dopant from the node electrode 120 into the N-well 160. The OD region 114 comprises one of the source/drain cap regions of the FET transistor 230. The P+ doped surface band/cap 112 on top of device 109 comprises the other one of the source/drain regions of the FET transistor 230. The gate electrode wordline 200, that is formed on the surface of the substrate 210, is separated from the N+ doped silicon, source/drain cap region 112 by the gate oxide layer 170. To the left of the gate electrode wordline 200, a bit diffusion drain contact 210 is formed on the top surface of the N+ doped silicon, source/drain cap region 112.

The buried-strap ST along with the OD region 114 are located in the space between about a minimum of about 50 nm and a maximum of about 300 nm from the interface at the semiconductor junction line 167 between the N-well 160 and the P+ doped buried plate electrode 165.

It will be recognized by those skilled in the art that the self-refreshing configuration described herein is not limited to the structure of the buried trench capacitor 16 of FIG. 2A and the buried trench capacitor 116 of FIG. 5A with a vertical pass transistor 35 described above. A self-refreshing memory element will consist of a charge transfer device, a charge storage device, and one or more semiconductor junctions, with geometry and bias conditions selected to impose a parasitic leakage device 24 operating to provide junction leakage current under one state (stored logical binary zero (0)) and to provide punchthrough leakage for a different state (stored logical binary one (1)). The self-refreshing may be applied to a conventional planar transistor with a trench capacitor in a DRAM cell.

An example of an alternative self refresh memory configuration can be a bipolar charge transfer device with a junction capacitance in place of the trench capacitor. Another example of an alternative self refresh memory configuration can be a planar MOS transistor with a magneto-resistive (tunnel junction) storage element.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims that follow.

Having thus described the invention, what is claimed as new and desirable to be secured by Letters Patent is as follows:

1. A static self-refreshing DRAM cell comprising:
    a deep trench having sidewalls and a bottom which is formed in a semiconductor substrate having upper, central and lower portions,
    a plate electrode of a capacitor formed in the substrate surrounding the lower portion of the deep trench, the plate electrode being doped with a first dopant type and being separated by an interface from a well region surrounding the upper and central portions of the deep trench, the well region being doped with an opposite dopant type, and a cap region formed above the well, the cap region being doped with the first dopant type, a node dielectric layer formed covering the sidewalls and bottom of the lower and central portions of the deep trench filled with a node electrode of the capacitor, the node electrode being doped with the first dopant type and being located within the space defined by the node dielectric layer in the lower and central portions of the deep trench, a buried-strap comprising a conductor formed about the upper portion of the node electrode, an outdiffusion region doped with the first dopant type formed in the well region proximate to the buried-strap, the cell including an FET transistor formed above the buried-strap and connected thereto having binary states comprising a first state and an opposite state of operation, and the cell including a punchthrough device formed in the well between the outdiffusion region and the interface, the punchthrough device providing a punchthrough current which provides self-refreshing current in the cell between the well and the plate in the first state of operation of the cell and reverse bias junction leakage in the cell between the buried-strap and the P-well occurs refreshing the opposite state of operation of the cell.

2. The device of claim 1 wherein:

the outdiffusion region is located from about 50 nm to about 300 nm from the interface between the well region and the plate electrode, in the well region there is an upper depletion region surrounding the outdiffusion region and a lower depletion region.

3. The device of claim 1 wherein the node dielectric layer and the buried-strap have a thickness from about 2 nm to about 10 nm.

4. The device of claim 1 wherein:

in a binary one stable state, the device automatically holds a binary one by exploiting leakage between the node electrode and the plate electrode through an expanded outdiffusion depletion region in the well surrounding the outdiffusion region and an expanded depletion region in the well between the interface and the outdiffusion depletion region which merge, in a binary zero stable state, the device automatically holds a binary zero by preventing leakage between the node electrode and the plate electrode through a contracted outdiffusion depletion region in the well surrounding the outdiffusion region and a contracted depletion region in the well between the interface and the outdiffusion depletion region which are separate regions in the well.

5. The device of claim 4 wherein the outdiffusion region is located about 50 nm to about 300 nm from the interface between the well region and the plate electrode.

6. The device of claim 4 wherein the node dielectric layer and the buried-strap have a thickness from about 2 nm to about 10 nm.

7. The device of claim 4 wherein:

the outdiffusion region is located from about 50 nm to about 300 nm from the interface between the well region and the plate electrode, and the node dielectric layer and the buried-strap have a thickness from about 2 nm to about 10 nm.

8. The device of claim 4 wherein:

the outdiffusion region is located about 50 nm to about 300 nm from the interface between the well region and the plate electrode, the node dielectric layer and the buried-strap have a thickness from about 2 nm to about 10 nm, and the node dielectric layer is recessed forming a space filled with the buried-strap.

9. The device of claim 1 wherein:

a recess on top of the node dielectric layer comprises a strap region space that surrounds the top of the node electrode, with the strap region space being filled with the buried-strap, the device operating so that in a binary one stable state, the device automatically holds a binary one by exploiting leakage between the node electrode and the plate electrode through an expanded outdiffusion depletion region in the well surrounding the outdiffusion region and an expanded depletion region in the well between the interface and the outdiffusion depletion region which merge, and the device operating so that in a binary zero stable state, the device automatically holds a binary zero by preventing leakage between the node electrode and the plate electrode through a contracted outdiffusion depletion region in the well surrounding the outdiffusion region and a contracted depletion region in the well between the interface and the outdiffusion depletion region which are separate regions in the well.

10. The device of claim 9 wherein the outdiffusion region is located about 50 nm to about 300 nm from the interface between the well region and the plate electrode.

11. The device of claim 9 wherein the node dielectric layer and the buried-strap are between about 2 nm and about 10 nm thick.

12. The device of claim 9 wherein the outdiffusion region is juxtaposed with the buried-strap and centered thereon.

13. The device of claim 9 wherein the buried-strap extends about 160 nm above the interface between the well region and the plate electrode.

14. A device comprising:

a deep trench having sidewalls and a bottom which is formed in a semiconductor substrate has upper, central and lower portions, a plate electrode of a capacitor formed in the substrate surrounding the lower portion of the deep trench, the plate electrode being doped with a first dopant type and being separated by an interface from a well region surrounding the upper and central portions of the deep trench, the well region being doped with an opposite dopant type, and a cap region formed above the well, the cap region being doped with the first dopant type, a node dielectric layer formed covering the sidewalls and bottom of the lower and central portions of the deep trench, the node dielectric layer defining a space in the lower and central portions of the deep trench filled with a node electrode of the capacitor, the node electrode being doped with the first dopant type, the node dielectric layer having been recessed about the upper portion of the node electrode filled with a buried-strap, and an outdiffusion region doped with the first dopant type is formed in the well region proximate to the buried-strap.

15. The device of claim 14 wherein:

in a binary one stable state, the device automatically holds a binary one by exploiting leakage between the node electrode and the plate electrode through an expanded outdiffusion depletion region in the well surrounding the outdiffusion region and an expanded depletion region in the well between the interface and the outdiffusion depletion region which merge, in a binary zero stable state, the device automatically holds a binary zero by preventing leakage between the node electrode and the plate electrode through a contracted outdiffusion depletion region in the well surrounding the outdiffusion region and a contracted depletion region in the well between the interface and the outdiffusion depletion region which are separate regions in the well.

16. The device of claim 15 wherein the outdiffusion region is located from about 50 nm to about 300 nm from the interface between the well region and the plate electrode.

17. The device of claim 15 wherein the node dielectric layer and the buried-strap have a thickness from about 2 nm to about 10 nm.

18. The device of claim 15 wherein:

the outdiffusion region is located from about 50 nm to about 300 nm from the interface between the well region and the plate electrode, and the node dielectric layer and the buried-strap have a thickness from about 2 nm to about 10 nm.

19. The device of claim 14 wherein a trench top dielectric layer is formed above the node electrode and the buried-strap in the central portion of the deep trench, a gate oxide layer formed on the sidewall surfaces of the upper portion of the deep trench above the trench top dielectric layer, a gate electrode is formed filling the space in the deep trench defined by the gate oxide layer, an upper source/drain region is formed above the well region with a channel region in the well region between the upper source/drain region and the outdiffusion region combining with the gate electrode and the gate oxide to form a transistor associated with the trench capacitor through the outdiffusion region and the strap region.

20. A method of forming a device starting with a deep trench having sidewalls and a bottom that is formed in a semiconductor substrate having upper, central and lower portions, a plate electrode of a capacitor formed in the substrate surrounding the lower portion of the deep trench doped with a first dopant type separated by an interface from a well region surrounding the upper and central portions of the deep trench doped with an opposite dopant type, and a cap region formed above the well doped with the first dopant type, comprising the steps as follows:

forming a node dielectric layer covering the sidewalls and bottom of the lower and central portions of the deep trench and filling the space defined by the node dielectric layer with a node electrode of the capacitor doped with the first dopant type and located within the space defined by the node dielectric layer in the lower and central portions of the deep trench, forming a strap region space about the upper portion of the node electrode, filling the strap recess in the node dielectric layer with a buried-strap, forming a trench top dielectric layer above the node electrode and the buried-strap covering the top of the central portion of the deep trench, forming a gate oxide layer on the sidewall surfaces of the upper portion of the deep trench with a gate electrode formed filling the space in the deep trench defined by the gate oxide layer, and forming an outdiffusion region doped with the first dopant type in the well region proximate to the buried-strap.

\* \* \* \* \*